United States Patent [19]

Avery

[11] 4,443,716
[45] Apr. 17, 1984

[54] SYMMETRICAL-HYSTERESIS HALL SWITCH

[75] Inventor: Grant D. Avery, Loudon, N.H.

[73] Assignee: Sprague Electric Company, North Adams, Mass.

[21] Appl. No.: 342,686

[22] Filed: Jan. 26, 1982

[51] Int. Cl.³ .................. H03K 17/90; H03K 3/26; H01L 43/06

[52] U.S. Cl. .................. 307/309; 307/303; 324/117 H; 323/294; 323/368

[58] Field of Search .................. 307/309, 303; 324/117 H; 323/368, 294

[56] References Cited

U.S. PATENT DOCUMENTS

| | | | |
|---|---|---|---|
| 4,295,118 | 10/1981 | Herr et al. | 323/294 |
| 4,296,410 | 10/1981 | Higgs et al. | 307/309 |
| 4,322,709 | 3/1982 | Vonder et al. | 323/368 |

Primary Examiner—Stanley D. Miller
Assistant Examiner—B. P. Davis

[57] ABSTRACT

A magnet is bonded to a skewed-hysteresis Hall switch in such a position that the magnetic flux, normal to the Hall element, is equal to the average of the magnetic flux required to operate and the magnetic flux required to release the Hall switch. This magnet-Hall-switch assembly is made by initially employing a magnet of much greater strength than needed. The Hall switch is energized and subjected to an oscillating field of zero average value. The on-time to off-time ratio of the magnet-Hall-switch assembly is measured. A demagnetizing field is adjusted to a strength that is directly related to the difference between unity and the Hall switch on-to-off time, and the magnet is then subjected to the adjusted demagnetizing field. These steps are repeated several times. The magnet is thus partially demagnetized to import to the magnet-biased Hall switch a symmetrical hysteresis characteristic. This symmetrical-hysteresis Hall switch is very sensitive and leads to more reliable operation in rotational speed monitoring devices such as speedometers and certain flow meters.

4 Claims, 13 Drawing Figures

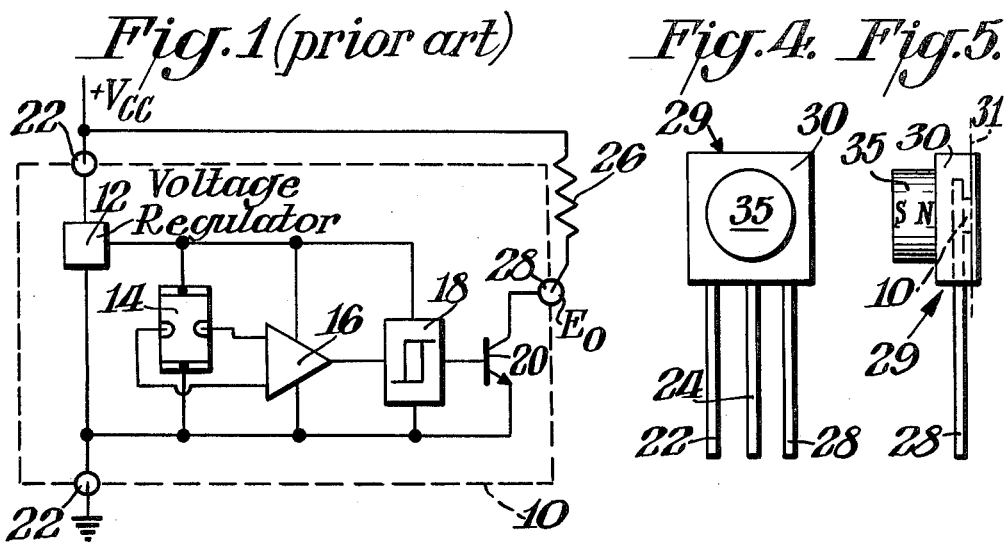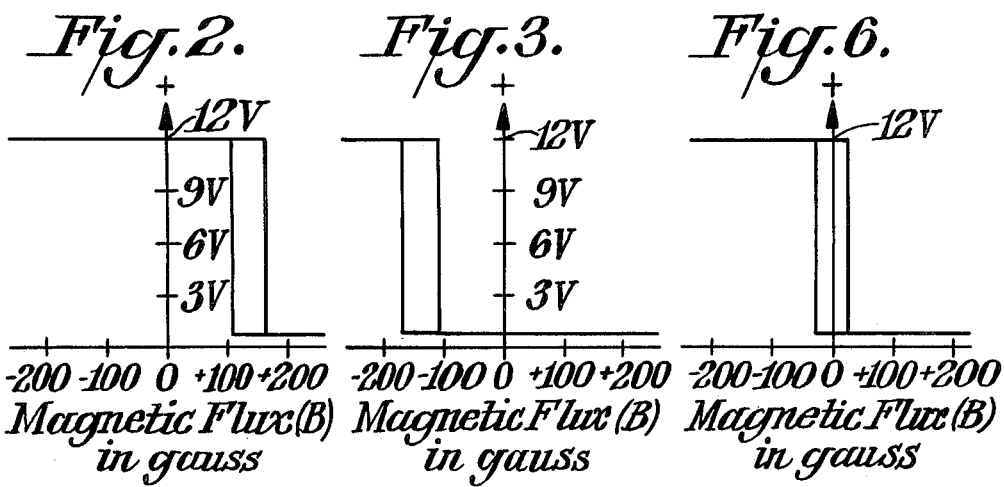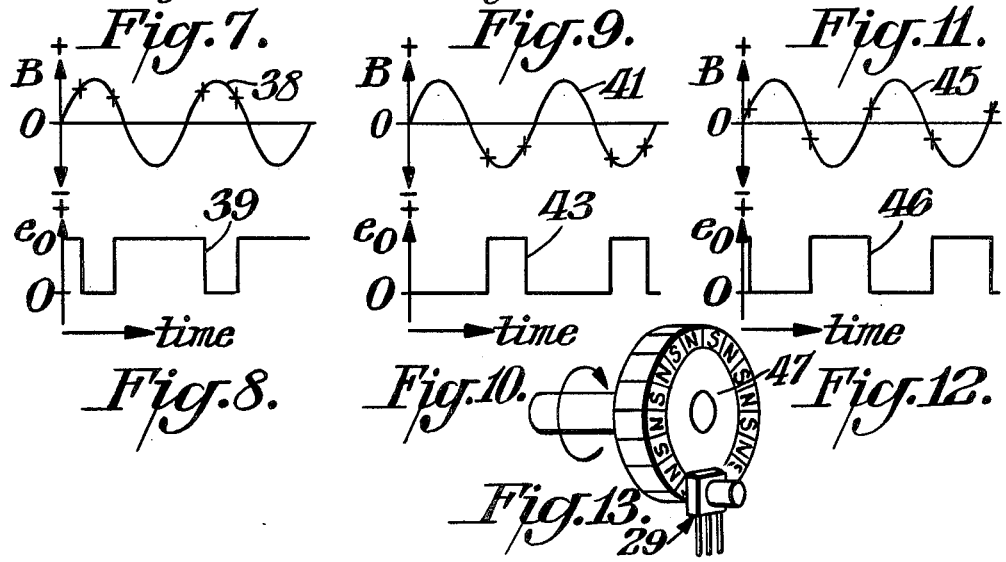

SYMMETRICAL-HYSTERESIS HALL SWITCH

BACKGROUND OF THE INVENTION

This invention relates to a Hall switch of the type including a Hall element connected to a voltage threshold detector means with hysteresis, and more particularly to a symmetrical hysteresis switch requiring the same magnitude north (or south) pole magnetic field to turn it on as required of a south (or north) pole magnetic field to turn it off.

Typically, integrated Hall switches turn on when the ambient magnetic field normal to the plane of the Hall element is in one of the two relative directions, e.g. +, and exceeds an "operate" point magnitude. Such switches turn off while the ambient magnetic field is of the same polarity and drops below the operate point magnitude to a "release" point magnitude. In other words, a plot of output (voltage) versus ambient magnetic field shows a hysteresis loop that is skewed relative to the zero field axis. Thus when there is no ambient magnetic field the Hall switch is always off.

Such Hall switches are often used as proximity sensors whereby the moving part to be sensed includes a magnet. To operate the Hall switch, the magnet must be strong enough and come close enough, that the ambient magnetic field will reach the above-noted operate point magnitude of the Hall switch. A typical commercial Hall switch of this type has a maximum guaranteed "operate" flux of 350 gauss and a minimum "release" flux of 50 gauss.

Another commercial Hall switch is guaranteed to have a maximum operate flux of +250 gauss and a minimum release flux of −250 gauss. This same Hall switch has a typical hysteresis of 50 gauss usually centered at about +130 gauss. More sensitive Hall switches, for example those including amplifiers with greater gain, exhibit greater drift of those transition points in the hysteresis loop with temperature and stress.

It is an object of this invention to provide a Hall switch having greater sensitivity without an accompanying increase in drift of transition (operate and release) points with temperature or stress.

It is a further object of this invention to provide symmetrical-hysteresis Hall switches with lower and more uniform switching thresholds.

SUMMARY OF THE INVENTION

An integrated-circuit skewed-hysteresis Hall switch includes a Hall element for producing a Hall voltage that is proportional to the ambient magnetic field, and a voltage-threshold detector means for producing one electrical output condition when the ambient magnetic field normal to the Hall element is less than one value and another output condition when the ambient normal field of the same direction exceeds a second and larger value. A magnet is mounted with the Hall switch and has a relative position and a strength to produce a magnetic field normal to the Hall element that is essentially the average value of the aforementioned first and second values.

An unusually small externally generated magnetic field may be imposed (superimposed) upon this magnet-biased Hall switch with symmetrical hysteresis to actuate it. The symmetrical hysteresis feature and the enhanced sensitivity lead to a much more reliable performance as a sensor of an alternating magnetic field.

This symmetrical-hysteresis Hall switch is manufactured by first bonding to a conventional skewed-hysteresis Hall switch a magnet stronger than necessary to activate the switch.

Then the strong-magnet-biased Hall switch is subjected to a group of steps comprising measuring the ratio of on-time to off-time of the switch being exposed to an oscillating magnetic field of zero average value, adjusting the level of an alternating demagnetizing field as a direct function of the difference between the last measured ratio, and placing the magnet-Hall-switch assembly in the demagnetizing field to reduce the strength of the magnet.

The above noted group of steps is then repeated as many times as is needed to obtain a desired degree of symmetry.

It is possible to make a symmetrical-hysteresis Hall switch, without a bias magnet, by adding signal shifting circuits to the integrated circuit. However, in manufacturing the variations in the Hall-element offset voltages, Hall element sensitivity (volts per gauss), and thereshold-detector-means operate and release levels all tend to combine to produce a very wide spread in Hall switch operate and release flux levels. On the other-hand, the magnet-biased symmetrical-hysteresis Hall switch of this invention is adjusted to compensate for this lack of uniformity in initial operating characteristics of a mass produced integrated-circuit Hall switch. These initial operating characteristics are less predictable or controllable than are their rate of change with temperature. Thus, although the adjustment in magnet strength to achieve hysteresis symmetry is done at one temperature, the uniformity of this product at all temperatures is much improved.

BRIEF DESCRIPTION OF THE DRAWINGS

FIG. 1 shows a block diagram of a Hall switch of the prior art.

FIG. 2 shows a graph of output voltage as a function of somewhat magnetic flux for a Hall switch of the prior art, e.g. as represented by the diagram of FIG. 1.

FIG. 3 shows a graph of output voltage as a function of ambient magnetic flux for another Hall switch of the prior art.

FIG. 4 shows a back view of a Hall switch of this invention.

FIG. 5 shows a side view of the Hall switch of FIG. 4.

FIG. 6 shows a graph of output voltage as a function of ambient magnetic flux for the Hall switch of this invention depicted in FIGS. 4 and 5.

FIGS. 7 and 8 show an oscillating waveform of ambient magnetic flux and a corresponding voltage-output waveform, respectively, for the prior art Hall switches of FIG. 1, that responds as indicated in FIG. 2.

FIGS. 9 and 10 show an oscillating waveform of ambient magnetic flux and a corresponding output voltage waveform, respectively, for the prior art Hall switch that responds as indicated in the graph of FIG. 3.

FIGS. 11 and 12 show an oscillating waveform of ambient magnetic flux and a corresponding output voltage waveform, respectively, for the switch of this invention represented by FIGS. 4, 5, and 6.

FIG. 13 shows in perspective view a rotating multiple-pole ring magnet with the Hall switch of this invention, of FIGS. 4, 5, and 6, fixedly mounted adjacent the rotating ring.

DESCRIPTION OF THE PREFERRED EMBODIMENTS

Referring to the block diagram of FIG. 1, a conventional integrated-circuit skewed-hysteresis Hall switch 10 includes a voltage regulator 12, a Hall element 14, a differential amplifier 16, a Schmitt-trigger circuit 18, and an output transistor 20 that is off for one state of the Schmitt-trigger circuit and is driven on and into saturation when the Schmitt trigger circuit 18 is in the other state. A DC voltage, e.g. 12 volts, is applied across the terminals 22 and 24. A load resistor 26, of about 2 K ohms, is connected between the output terminal 28 and the positive DC supply terminal 22.

When the magnetic flux normal to the plane of the Hall element 14 and the integrated circuit 10 is in the direction, designated here as +, to activate the Hall switch, it must exceed about +160 gauss to cause the transistor 20 to turn on (to "operate") and must drop to a value of less than about +110 gauss in accordance with the corresponding graph of FIG. 2 to turn it off again (to "release"). The hysteresis in this case is 50 gauss. This particular Hall switch 10 is a commercial-type UGN-3030T made by the Sprague Electric Company, Concord, N.H.

A similar skewed hysteresis Hall switch, except responsive to magnetic fields of the other polarity, e.g. —, is represented by the graph of FIG. 3. In fact, the integrated circuit of FIG. 1 may be simply modified to so convert it. One way to accomplish this conversion is to reverse the conductors from the outputs of the Hall element 14 at the inputs of the amplifier 16.

In a Hall switch of this invention, an insulative housing 30 encloses the integrated circuit 10 so that the plane 31 of the Hall-element is parallel with that of the front face of the housing 30 as shown in FIGS. 4 and 5. The north pole face of a magnet 35 is bonded to the rear face of the Hall-switch housing 30. This produces at the Hall cell a magnetic field that is of a polarity (+) that can operate the Hall switch as indicated in FIG. 2. The strength of this magnet-produced field is just enough to equal the average value of the operate and release fields, so that much smaller fields produced by external sources are effective in activating the Hall switch. This magnet-biased Hall switch thus exhibits a hysteresis switching characteristic that is symmetrical about the zero field axis as shown in FIG. 6.

When the skewed hysteresis Hall switch of FIG. 1 is subjected to an oscillating magnetic field having a waveform 38 as in FIG. 7, the output voltage at output terminal 38 will have a voltage waveform 39 as shown in FIG. 8. Likewise in response to an oscillating flux having waveform 41 in FIG. 9, the second prior art Hall switch described above will have the output voltage waveform 42, as in FIG. 10. However, when an oscillating magnetic flux of waveform 45 in FIG. 11 is ambient to the above described magnet-biased Hall switch, it will result in a symmetrical output voltage waveform 46 as shown in FIG. 12.

In FIG. 13 a multiple-pole ring magnet 47 is rotated and the Hall switch 29 is fixedly mounted with the front face a few millimeters away from the periphery of the rotating ring. At the periphery of this ring magnet 47 are a series of regions that are alternately magnetized to produce magnetic north poles (N) interleaved with magnetic south poles (S). The Hall switch 29 will be exposed to an oscillating magnetic field of the kind represented by waveform 45 (and 38 and 41). It has a near zero average value. The frequency of the output-voltage (waveform 46 in FIG. 12) is proportional to the speed with which the ring 47 rotates. Similarly the frequency of the output voltages (waveforms 39 and 43) of the prior art Hall switches, when mounted adjacent the rotating ring 47, will be proportional to the ring speed of rotation. Such rotating ring magnets and Hall switch sensors are used in speedometers and flow meters.

The oscillating magnetic flux ambient to a Hall switch, in all cases as represented by waveforms 38, 41 and 45 (FIGS. 7, 9 and 11) has a zero average value and a peak amplitude in each polarity of about 200 gauss. For this amplitude of magnetic flux, the above described prior art Hall switches have output voltages ($e_o$) that have an average value ($E_o$) of about $\frac{1}{3}$ $V_{CC}$ and $\frac{2}{3}$ $V_{CC}$ (8 and 4 volts, respectively, when $V_{cc} = 12$ V). For the symmetrical-hysteresis Hall switch 29, the output voltage has an average value $\frac{1}{2}$ $V_{cc}$ (6 volts when $V_{cc} = 12$). If the amplitude of the oscillating magnitude fields is reduced ten percent, the average output voltages of the prior art devices becomes more nearly 11 and 1 volts, respectively, while that of the symmetrical-hysteresis Hall switch remains 6 volts. A further reduction in the peak amplitudes of the ambient magnetic flux would cause the prior art devices to cease switching at all while the Hall switch 29 would operate essentially unchanged until the ambient peak magnetic flux drops much lower to near 25 gauss.

The symmetrical-hysteresis hall switch is clearly much more stable and reliable. This will be more fully appreciated when temperature related changes are considered, e.g. in Hall element offset voltage, Hall element sensitivity to magnetic flux, amplifier (16) gain and offset, and Schmitt trigger (18) threshold. These factors cause both a shifting of the hysteresis loop toward one or the other flux polarities and also change in width of the hysteresis loop. The reliability of the symmetrical-hysteresis Hall switch is plainly much greater than are devices of the prior art to both temperature-induced performance parameters and to factors that changes the level of ambient magnetic flux. This is immediately apparent from a comparison of the low operate and release points (indicated by +) in FIG. 11 compared to those in FIGS. 7 and 9.

The symmetrical-hysteresis Hall switch 29 was made by a process including the following steps.

A standard skewed hysteresis Hall switch 10 packaged in housing 30 was combined with a magnet 35 by bonding the magnet 35 to the backface of the housing 30 as shown in FIG. 5. The magnet 35 had a position and strength to produce a negative ambient magnetic field at the Hall element 10 that was enough to bias the Hall hysteresis loop well into the negative side of the flux to voltage diagram, for example a flux of −320 gauss which would result in a device having the characteristics about as illustrated in FIG. 3. Thus this strong magnet initially overdrives the Hall switch in the release direction.

In a subsequent step the Hall switch—magnet assembly was energized by connecting a DC voltage, $V_{cc}$, to its supply terminals 22 and 24. The assembly was then subjected to an oscillating magnetic field of ±75 gauss peaks. Under these conditions, the average output voltage, $E_{o1}$, was measured and seen to be substantially less than half of $V_{cc}$ (12 volts), that is the switch on-to-off time was substantially greater than unity (1.0), as would be expected from inspection of FIGS. 9 and 10. The magnet 35 was then partially demagnetized by subjecting the assembly 29 to an alternating demagnetizing field with peak field strength, $B_1$. The choice of this initial demagnetizing field strength $B_1$ was made, with reference to the charactersistic demagnetizing curve of the magnet 35 and with reference to the characteristic highest operate point of the integrated circuit model used as Hall switch 10, to make the operate point of the assembly 29 less negative (smaller).

The above procedure was then repeated, that is, the switch-magnet assembly 29 was energized and placed in a ±75 peak-gauss field, the new average output voltage $E_{o2}$ was measured and the assembly was subsequently subjected to an adjusted demagnetization field $B_2$. With reference to the above-noted magnet demagnetization curve and knowing the average output voltage $E_{o2}$, the adjusted field $B_2$ was chosen to change the average output voltage $E_{o2}$ to not quite equal ½ $V_{cc}$. The value $E_{o2}$ was nearer ½ $V_{cc}$ than the value $E_{o1}$; and the switch on-to-off time was closer to unity.

This group of steps including energizing, measurement of average output voltage, establishing a new level of demagnetizing field, and demagnetizing was repeated from 3 to 5 more times for each prototype sensor with the result that the output voltage $E_{o5}$ for each was within 1 percent of half the supply voltage $V_{cc}$. Thus almost perfect symmetry of the hysteresis loop about the zero field axis (see FIG. 6) was achieved.

What is claimed is:

1. A symmetrical-hysteresis Hall switch comprising:
   (a) an integrated circuit including a Hall element and a threshold detector means with hysteresis for producing one electrical output condition when the ambient magnetic field normal to said Hall element becomes greater than one value in one magnetic field polarity and another electrical output condition when said ambient magnetic field becomes less than a second and larger value in said one polarity; and
   (b) a magnet being fixedly mounted with respect to said integrated circuit and having a relative position and a strength to produce a magnetic field normal to said Hall element of a third value in said one polarity that is essentially equal to the average of said first and second values, to provide a symmetrical-hysteresis characteristic with respect to any superimposed ambient fields in said one and the other polarity.

2. The symmetrical Hall switch of claim 1 additionally comprising a housing; and metal leads that are electrically connected to said integrated circuit, said housing encompassing said integrated circuit and a portion of said leads, and said magnet being bonded to said housing.

3. A method for making a symmetrical-hysteresis Hall switch comprising:
   (a) combining in a rigid assembly a magnet and integrated-circuit Hall switch which includes a Hall element and a threshold detector means with hysteresis for producing one electrical output condition when the ambient magnetic field normal to said Hall element becomes greater than one value in one magnetic field polarity and another electrical output condition when said ambient magnetic field becomes less than a second and larger value in said one polarity, said magnet having a strength and position to overdrive said Hall switch to said another condition.
   (b) energizing said Hall switch;
   (c) producing an oscillating substantially sinusodal magnetic field of zero average value at said Hall switch to repeatedly operate said switch;
   (d) obtaining a measure of the ratio of the fraction of time that the Hall switch is in said one condition to the fraction of time said switch is in said another condition;
   (e) adjusting the peak magnitude of a oscillating demagnetizing field to a value that is a direct positive function of the difference between said ratio and unity.
   (f) introducing said magnet-Hall-switch assembly into said demagnetizing field; and
   (g) repeating steps c through f a number of times to render the hysteresis characteristic of said magnet Hall switch assembly essentially symmetrical.

4. The method of claim 3 wherein said one condition of said Hall switch corresponds to the output of said switch having a near zero impedance and said another condition corresponds to a high output impedance, and wherein said obtaining a measure of said ratio is achieved by connecting a resistive load to a DC supply voltage via said Hall switch output and measuring the average value of voltage across said switch.

* * * * *

UNITED STATES PATENT AND TRADEMARK OFFICE
CERTIFICATE OF CORRECTION

PATENT NO. : 4,443,716
DATED : April 17, 1984
INVENTOR(S) : Grant D. Avery

It is certified that error appears in the above—identified patent and that said Letters Patent is hereby corrected as shown below:

Cover page, under "[56] References Cited - U.S. PATENT DOCUMENTS" the following U.S. patents should be listed:

-- 2,725,504   11/1955   Dunlap, Jr.   317/235
   3,146,317   8/1964    Kuhrt et al   179/100.2
   3,845,445   10/1974   Braun et al   338/32H --

Cover page, under "[56] References Cited - OTHER PUBLICATIONS" the following should be listed:

-- Sprague Engineering Bulletin, 27701, "Hall Effect Application Guide", March 1980, pp. 16-18 --

Column 2, line 23, "there-" should read -- thre- --
Column 2, line 43, "somewhat" should read -- ambient --
Column 4, line 18, "V$_{CC}$" should read -- V$_{cc}$ --
Column 4, line 19, "V$_{CC}$" should read -- V$_{cc}$ --
Column 4, line 32, "hall" should read -- Hall --
Claim 3, line 16, "sinusodal" should read -- sinusoidal --

Signed and Sealed this

Seventeenth Day of July 1984

[SEAL]

Attest:

GERALD J. MOSSINGHOFF

Attesting Officer

Commissioner of Patents and Trademarks